(12) United States Patent
Yoshioka

(10) Patent No.: US 7,688,637 B2
(45) Date of Patent: Mar. 30, 2010

(54) MEMORY SELF-TEST CIRCUIT, SEMICONDUCTOR DEVICE AND IC CARD INCLUDING THE SAME, AND MEMORY SELF-TEST METHOD

(75) Inventor: Kazuki Yoshioka, Osaka (JP)

(73) Assignee: Panasonic Corporation, Osaka (JP)

( * ) Notice: Subject to any disclaimer, the term of this patent is extended or adjusted under 35 U.S.C. 154(b) by 466 days.

(21) Appl. No.: 11/790,479

(22) Filed: Apr. 25, 2007

(65) Prior Publication Data

US 2007/0279997 A1 Dec. 6, 2007

(30) Foreign Application Priority Data

Apr. 25, 2006 (JP) ............... 2006-120755

(51) Int. Cl.
*G11C 11/34* (2006.01)
(52) U.S. Cl. ............... 365/185.22; 365/189.07; 365/201
(58) Field of Classification Search ............ 365/185.22, 365/189.07, 201
See application file for complete search history.

(56) References Cited

U.S. PATENT DOCUMENTS

2005/0005131 A1 1/2005 Yoshida et al.
2006/0023500 A1* 2/2006 Kawabata et al. ...... 365/185.01

FOREIGN PATENT DOCUMENTS

JP 2004-102635 A 4/2004

* cited by examiner

*Primary Examiner*—Son Dinh
(74) *Attorney, Agent, or Firm*—McDermott Will & Emery LLP

(57) ABSTRACT

In a semiconductor device, a self-test circuit includes a write part for writing data in a given address of a special region of a nonvolatile memory; a read part for reading the written data from the given address; a verify part for determining whether or not the written data accords with the read data; and a decision part for determining soundness of the nonvolatile memory on the basis of a result of determination made by the verify part. In the case where the written data accords with the read data, the decision part determines that the nonvolatile memory is sound, and in the case where the data do not accord with each other, it determines that the nonvolatile memory is unsound.

18 Claims, 4 Drawing Sheets

MEMORY SELF-TEST CIRCUIT, SEMICONDUCTOR DEVICE AND IC CARD INCLUDING THE SAME, AND MEMORY SELF-TEST METHOD

BACKGROUND OF THE INVENTION

The present invention relates to self-test technique for a nonvolatile memory, and more particularly, it relates to memory self-test method and circuit for checking the soundness of a nonvolatile memory necessary to be in sufficient security.

In an LSI for storing highly confidential data or programs, or an LSI including a security circuit for an IC card or the like, significant data or programs with high confidentiality are stored in a nonvolatile memory such as a flash memory or a FeRAM. For example, in a nonvolatile memory of an LSI for an IC card, personal information, authentication data or cryptographic key data for a cryptographic system is stored. Since very significant contents are thus stored in a nonvolatile memory, it is necessary to provide means for preventing a malicious third party from decoding or modifying the data. For this purpose, it is effective to encode data to be stored in a nonvolatile memory.

In order to further increase the security level, information corresponding to a security status is stored in a nonvolatile memory so as to restrict an invalid access itself. In some conventional technique for security protection, the number of fails made in authentication for accessing a nonvolatile memory is written in the nonvolatile memory, and when the number exceeds a given value, it is regarded that an invalid access is being made. Thus, authentication to be made thereafter is rejected, confidential data stored in the nonvolatile memory is deleted, or the starting time in next power supply is elongated.

Even when such means for protecting the security is provided, however, an invalid access cannot be effectively restricted unless the number of authentication fails is correctly incremented. In the case where physical modification for disabling data write is made on a nonvolatile memory by, for example, fixing a write enable signal to a disable state or disconnecting a power line necessary for data write, information corresponding to a security status stored in the nonvolatile memory cannot be updated. As a result, even when authentication fails are repeatedly made, the number of fails is not incremented, and hence, it is impossible to restrict the invalid access.

It can be checked whether or not a nonvolatile memory has been physically modified, namely, the soundness of the nonvolatile memory can be checked, by verifying written data. However, when the verification is performed every time data is written, the power consumption is increased and the data write speed is lowered, and in addition, the lifetime of the nonvolatile memory may be shortened because the number of memory accesses is thus increased.

SUMMARY OF THE INVENTION

In consideration of the aforementioned conventional problems, an object of the invention is easily determining whether or not a nonvolatile memory has been physically modified without degrading the operation characteristics and the lifetime of the nonvolatile memory.

In order to solve the aforementioned problems, the memory self-test circuit for a nonvolatile memory according to the present invention includes a write part for writing data in a given address of a special region of the nonvolatile memory; a read part for reading the written data from the given address; a verify part for determining whether or not the written data accords with the read data; and a decision part for determining, on the basis of a result of determination made by the verify part, that the nonvolatile memory is sound when the written data accords with the read data and that the nonvolatile memory is unsound when the written data does not accord with the read data. Also, the memory self-test method of the present invention for checking soundness of a nonvolatile memory includes a first step of writing data in a given address of a special region of the nonvolatile memory; a second step of reading the written data from the given address; a third step of determining whether or not the written data accords with the read data; and a fourth step of determining, on the basis of a result of determination made in the third step, that the nonvolatile memory is sound when the written data accords with the read data and that the nonvolatile memory is unsound when the written data does not accord with the read data.

Thus, data is written by the write part in the given address of the special region of the nonvolatile memory, the written data is read by the read part from the given address, the accordance of these data is determined by the verify part, and the decision part determines whether or not the nonvolatile memory is sound on the basis of the result of the determination made by the verify part. Since the soundness of the nonvolatile memory is thus checked by using the special region typically, it is easily determined whether or not the nonvolatile memory has been physically modified without degrading the operation characteristics and the lifetime of the nonvolatile memory.

Specifically, the nonvolatile memory includes a plurality of memory banks each having a special region. In the memory self-test circuit, the write part writes data in the given address of the special region of each of the plurality of memory banks, the read part reads the written data from the given address of each of the plurality of memory banks, the verify part determines whether or not the written data accords with the read data in each of the plurality of memory banks, and the decision part determines that the nonvolatile memory is sound when the written data accords with the read data in all of the plurality of memory banks and that the nonvolatile memory is unsound when the written data does not accord with the read data in all of the plurality of memory banks. Also, in the memory self-test method, data is written in the given address of the special region of each of the plurality of memory banks in the first step, the written data is read from the given address of each of the plurality of memory banks in the second step, it is determined in the third step whether or not the written data accords with the read data in each of the plurality of memory banks, and it is determined in the fourth step that the nonvolatile memory is sound when the written data accords with the read data in all of the plurality of memory banks and that the nonvolatile memory is unsound when the written data does not accord with the read data in all of the plurality of memory banks.

Thus, the soundness of each memory bank is checked by using the special region, and the nonvolatile memory is determined to be sound when all the memory banks are sound. Therefore, even when a part of the memory banks suffers from security attack, it can be appropriately detected, so as to secure a higher security level in the whole nonvolatile memory.

The memory self-test circuit preferably further includes a select part for selecting one address out of a plurality of addresses of the special region. The write part writes data in the address selected by the select part, and the read part reads the written data from the address selected by the select part.

Specifically, the select part selects one of the plurality of addresses at random or in turn. Similarly, the memory self-test method preferably further includes a fifth step of selecting one of a plurality of address of the special region. In this case, in the first step, data is written in the address selected in the fifth step, and in the second step, the data written in the first step is read from the address selected in the fifth step. Specifically, one of the plurality of addresses is selected at random or in turn in the fifth step.

Thus, the addresses used for checking the soundness of the nonvolatile memory are reasonably dispersed, and hence, the number of times of writing data in a specific address is prevented from becoming extremely large. In other words, the degradation of the lifetime of the nonvolatile memory restricted in the number of write times is avoided.

On the other hand, according to the present invention, the semiconductor device or the IC card equipped with a nonvolatile memory includes a memory self-test circuit for checking soundness of the nonvolatile memory. The memory self-test circuit includes a write part for writing data in a given address of a special region of the nonvolatile memory; a read part for reading the written data from the given address; a verify part for determining whether or not the written data accords with the read data; and a decision part for determining, on the basis of a result of determination made by the verify part, that the nonvolatile memory is sound when the written data accords with the read data and that the nonvolatile memory is unsound when the written data does not accord with the read data.

Thus, in the semiconductor device or the IC card equipped with the nonvolatile memory, the data is written by the write part in the given address of the special region of the nonvolatile memory, the written data is read by the read part from the given address, the accordance of these data is determined by the verify part, and the decision part determines whether or not the nonvolatile memory is sound on the basis of the result of the determination made by the verify part. Since the soundness of the nonvolatile memory is thus checked by using the special region typically, it is easily determined whether or not the nonvolatile memory has been physically modified without degrading the operation characteristics and the lifetime of the nonvolatile memory.

The semiconductor device preferably further includes a power on reset circuit for outputting a reset signal when power is supplied to the semiconductor device. In this case, the memory self-test circuit checks the soundness of the nonvolatile memory in response to the reset signal.

Thus, the soundness of the nonvolatile memory is checked when power is supplied to the semiconductor device, and appropriate post-processing can be properly performed in accordance with the result of the check.

The semiconductor device preferably further includes a timer circuit for outputting a timer signal every time a given length of time is timed. In this case, the memory self-test circuit checks the soundness of the nonvolatile memory in response to the timer signal.

Thus, the soundness of the nonvolatile memory is periodically checked, and hence, a higher security level is secured.

Specifically, the semiconductor device further includes a CPU for executing a provided program and outputting a control signal when a library function related to an access to the nonvolatile memory is invoked, and the memory self-test circuit checks the soundness of the nonvolatile memory in response to the control signal.

Thus, the soundness of the nonvolatile memory is checked when it is accessed, and hence, the self-test is efficiently performed.

Specifically, the semiconductor device further includes a CPU for executing a provided program and outputting a control signal when an instruction specified by a user is executed, and the memory self-test circuit checks the soundness of the nonvolatile memory in response to the control signal.

Thus, the timing for checking the soundness of the nonvolatile memory is arbitrarily specified by a user, and hence, the check of the soundness of the nonvolatile memory is executed in case of necessity.

Specifically, the IC card further includes a transmit-receive circuit for communicating with a reader/writer; and a control circuit for accessing the nonvolatile memory in accordance with a command received by the transmit-receive circuit and outputting a control signal before accessing the nonvolatile memory. The memory self-test circuit checks the soundness of the nonvolatile memory in response to the control signal, and the control circuit accesses the nonvolatile memory when the soundness of the nonvolatile memory is confirmed by the memory self-test circuit.

Thus, the control circuit cannot access the nonvolatile memory unless the soundness of the nonvolatile memory is confirmed by the memory self-test circuit. Therefore, even when the nonvolatile memory has been physically modified, confidential information stored therein is never invalidly read.

Specifically, the IC card further includes a transmit-receive circuit for communicating with a reader/writer; and a control circuit for accessing the nonvolatile memory in accordance with a command received by the transmit-receive circuit and outputting a control signal after accessing the nonvolatile memory. The memory self-test circuit checks the soundness of the nonvolatile memory in response to the control signal, and the control circuit instructs the transmit-receive circuit to transmit a response when the soundness of the nonvolatile memory is confirmed by the memory self-test circuit.

Thus, a response is never transmitted from the transmit-receive circuit to the reader/writer unless the soundness of the nonvolatile memory is confirmed by the memory self-test circuit. Therefore, even when the nonvolatile memory has been physically modified, a process result based on invalid data is never transmitted to the reader/writer.

BEST MODE FOR CARRYING OUT THE INVENTION

Preferred embodiments of the invention will now be described with reference to the accompanying drawings.

Embodiment 1

Figure 1:
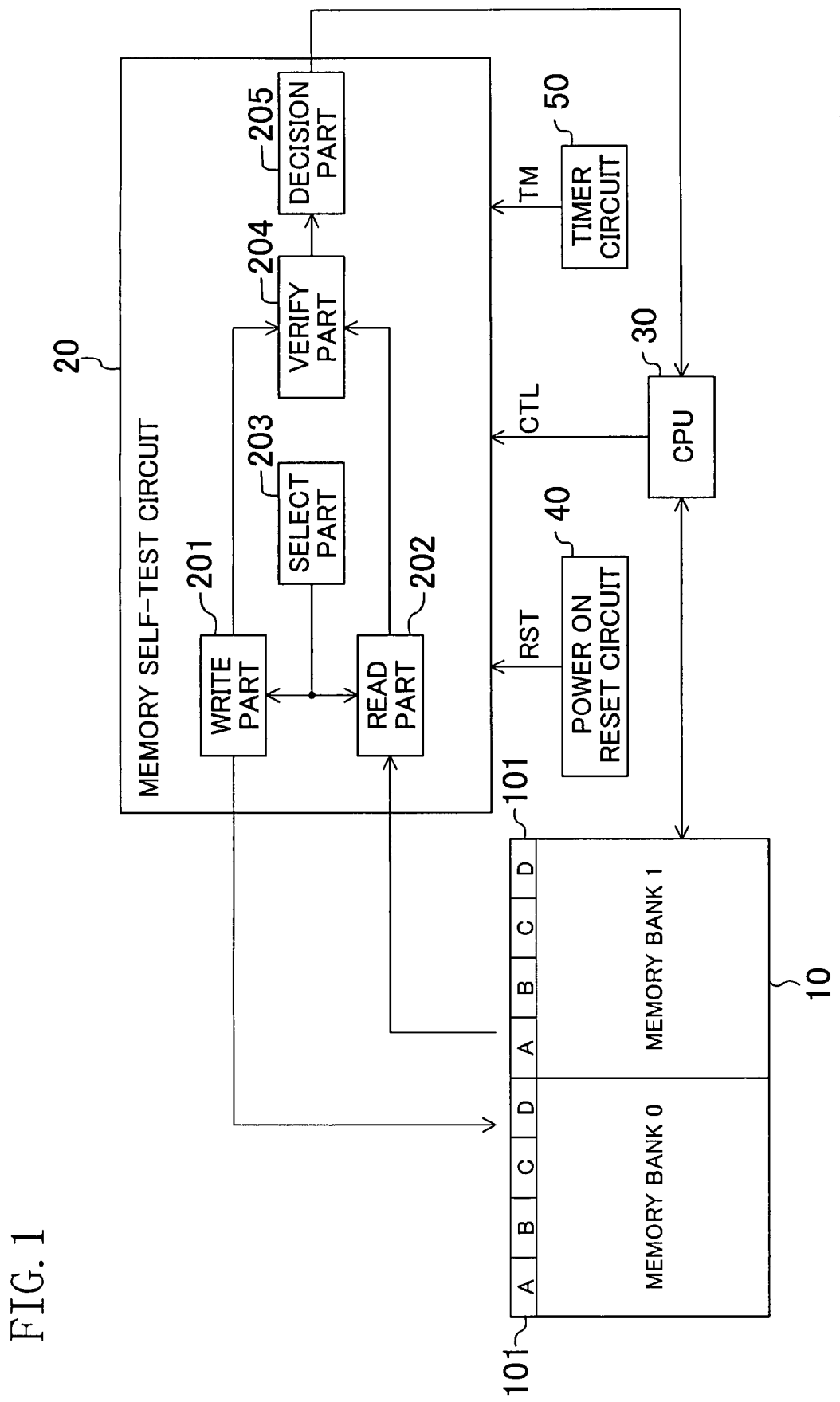
FIG. 1 is a diagram for showing the architecture of a semiconductor device according to Embodiment 1.

FIG. 1 shows the architecture of a semiconductor device according to Embodiment 1. The present semiconductor device includes a nonvolatile memory 10, a memory self-test circuit 20, a CPU 30, a power on reset circuit 40 and a timer circuit 50.

The nonvolatile memory 10 is, for example, a FeRAM, a flash memory or the like. The nonvolatile memory 10 includes two memory banks each having a special region 101. Each special region 101 includes four addresses A, B, C and D. The special region 101 is a dummy region provided for checking the soundness of the nonvolatile memory 10.

The memory self-test circuit 20 checks the soundness of the nonvolatile memory 10 by using the special regions 101 of the respective memory banks. Specifically, the memory self-test circuit 20 includes a write part 201, a read part 202, a select part 203, a verify part 204 and a decision part 205. The select part 203 selects one address to be read or to be written from the four addresses of the special region 101 of each memory bank. The address may be selected at random or in turn. The write part 201 writes arbitrary data in the address selected by the select part 203. The read part 202 reads the data having been written by the write part 201 from the address selected by the select part 203. The verify part 204 determines whether or not the data written by the write part 201 accords with the data read by the read part 202. In other words, the verify part 204 verifies the correctness of the data written by the write part 201. The decision part 205 receives the verification result obtained by the verify part 204 and determines that the nonvolatile memory 10 is sound when these data accord with each other and determines that the nonvolatile memory 10 is unsound because it may have been physically modified when the data do not accord with each other.

Since the special region 101 is used every time the soundness of the nonvolatile memory 10 is checked, it is more frequently accessed than other general regions, and therefore, its lifetime may be expired comparatively early so that the soundness of the nonvolatile memory 10 cannot be effectively checked. However, when a plurality of addresses are prepared for the special region 101 as described above so as to appropriately use one of the addresses, the number of times of writing data in a specific address is prevented from becoming extremely large.

Figure 2:
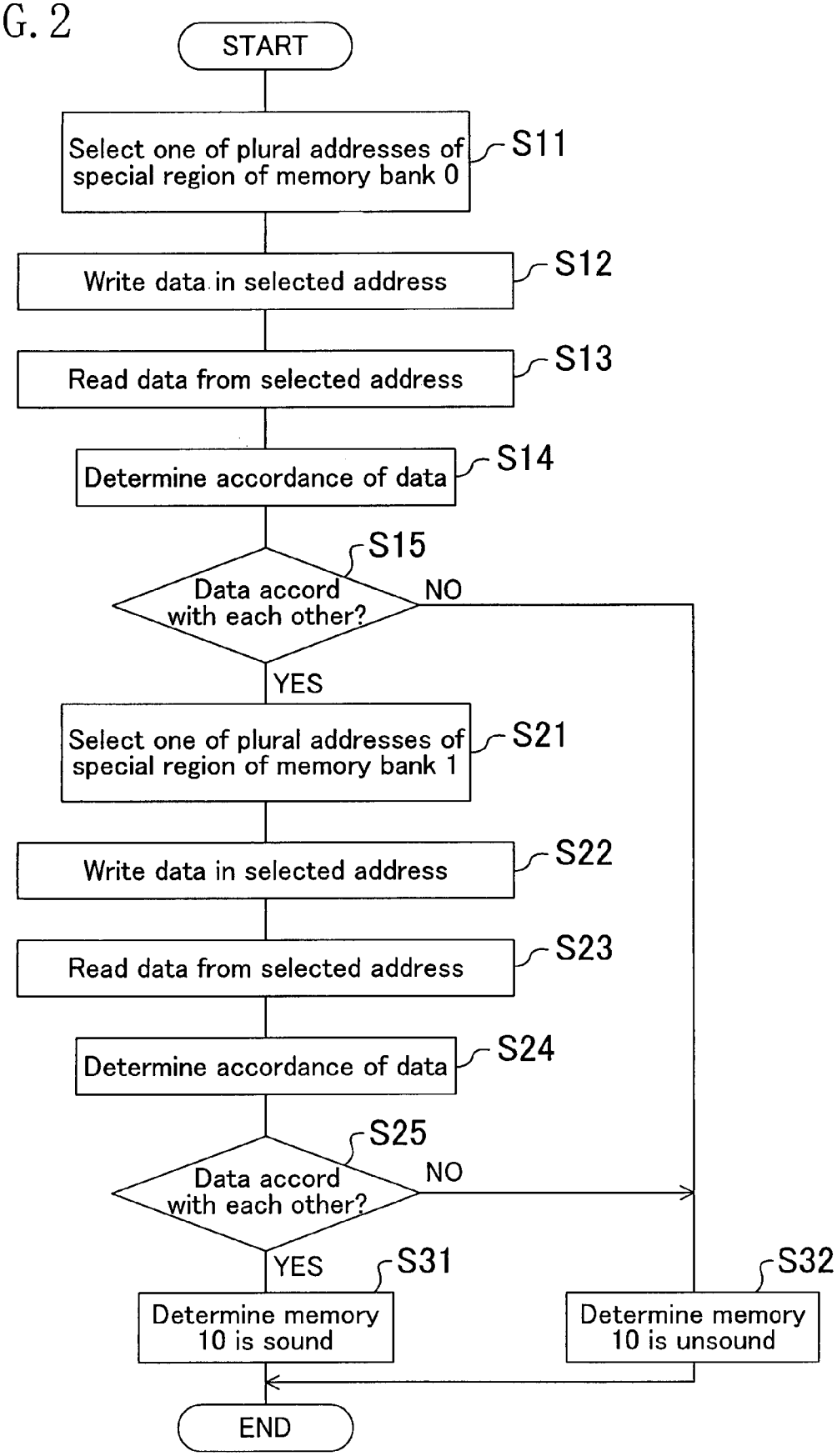
FIG. 2 is a flowchart for a memory self-test circuit shown in FIG. 1.

Next, with reference to a flowchart of FIG. 2, the operation of the memory self-test circuit 20 will be described. First, the select part 203 selects one of the four addresses of the special region 101 of the memory bank 0 (step S11). Then, arbitrary data is written in the selected address by the write part 201 (step S12), and thereafter, the written data is read from the selected address by the read part 202 (step S13). The verify part 204 determines whether or not the data written by the write part 201 accords with the data read by the read part 202 (step S14). In the case where the data accord with each other (i.e., YES in step S15), similar processing is performed on the memory bank 1. Specifically, one of the four addresses of the special region of the memory bank 1 is selected (step S21), arbitrary data is written in the selected address (step S22), the written data is read from the selected address (step S23), and it is determined whether or not these data accord with each other (step S14). In the case where these data accord with each other (i.e., YES in step S25), the decision part 205 determines that the nonvolatile memory 10 is sound (step S31). On the other hand, in the case where the data do not accord with each other (i.e., NO) in step S15 or S25, the decision part 205 determines that the nonvolatile memory 10 is unsound (step S32).

Referring to FIG. 1 again, the CPU 30 executes a provided program and properly accesses the nonvolatile memory 10. Also, the CPU 30 may output a control signal CTL in invoking a library function related to an access to the nonvolatile memory 10 or in executing an instruction specified by a user. In the latter case, the processing for checking the soundness of the nonvolatile memory 10 is set as a library function so that the library function can be properly invoked in a user program. The memory self-test circuit 20 checks the soundness of the nonvolatile memory 10 in response to the control signal CTL. Thus, the soundness of the nonvolatile memory 10 is checked when it is accessed, and therefore, a highly efficient self-test is realized. Furthermore, the timing of checking the soundness of the nonvolatile memory 10 can be arbitrarily set by a user, and thus, the soundness of the nonvolatile memory 10 is checked in case of necessity.

Moreover, the CPU 30 receives the result of the determination made by the decision part 205 and executes an expected operation by properly accessing the nonvolatile memory 10 when the soundness of the nonvolatile memory 10 is confirmed. On the other hand, when it is determined on the basis of the determination result obtained by the decision part 205 that any abnormality has been caused in the nonvolatile memory 10, the CPU 30 performs processing for restricting the access to the nonvolatile memory 10. Specifically, the CPU 30 performs reset processing for the semiconductor device or executes closed loop processing so that the nonvolatile memory 10 cannot be accessed.

The power on reset circuit 40 outputs a reset signal RST when power is supplied to this semiconductor device. The memory self-test circuit 20 checks the soundness of the nonvolatile memory 10 in response to the reset signal RST. Thus, the soundness of the nonvolatile memory 10 is checked when power is supplied to the semiconductor device, so that appropriate post-processing can be performed in accordance with the result of the check. It is noted that the power on reset circuit 40 may be omitted.

The timer circuit 50 outputs a timer signal TM every time it times a given length of time. The memory self-test circuit 20 checks the soundness of the nonvolatile memory 10 in response to the timer signal TM. Thus, the soundness of the nonvolatile memory 10 is periodically checked so as to secure a higher security level. It is noted that the timer circuit 50 may be omitted.

In this manner, according to this embodiment, it is properly determined whether or not the nonvolatile memory has been physically modified by using the special regions. Therefore, the soundness of the nonvolatile memory is checked without increasing the power consumption and without reducing the data write speed and the lifetime of the nonvolatile memory. In other words, an invalid access such as security attack utilizing abnormality of the nonvolatile memory is restricted without degrading the operation characteristics and the lifetime of the nonvolatile memory, so that highly confidential data stored in the nonvolatile memory can be effectively protected.

It is noted that the address may be uniformly selected in all the memory banks. Specifically, when the address A is selected in the memory bank 0, the address A may be selected also in the memory bank 1.

Furthermore, the number of addresses included in the special region 101 may be one. In this case, the select part 203 of the memory self-test circuit 20 can be omitted. Also, the number of memory banks included in the nonvolatile memory 10 may be one, or three or more. In the case where the number of memory banks is one, the procedures performed in steps S21 through S25 of the flowchart of FIG. 2 are omitted. Alternatively, in the case where the number of memory banks is three or more, procedures similar to those performed in steps S11 through S15 are additionally performed between steps S25 and S31 in the flowchart of FIG. 2.

Moreover, the processing performed by the memory self-test circuit 20 may be executed as software in the CPU 30. In this case, the memory self-test circuit 20 is omitted.

Embodiment 2

Figure 3:
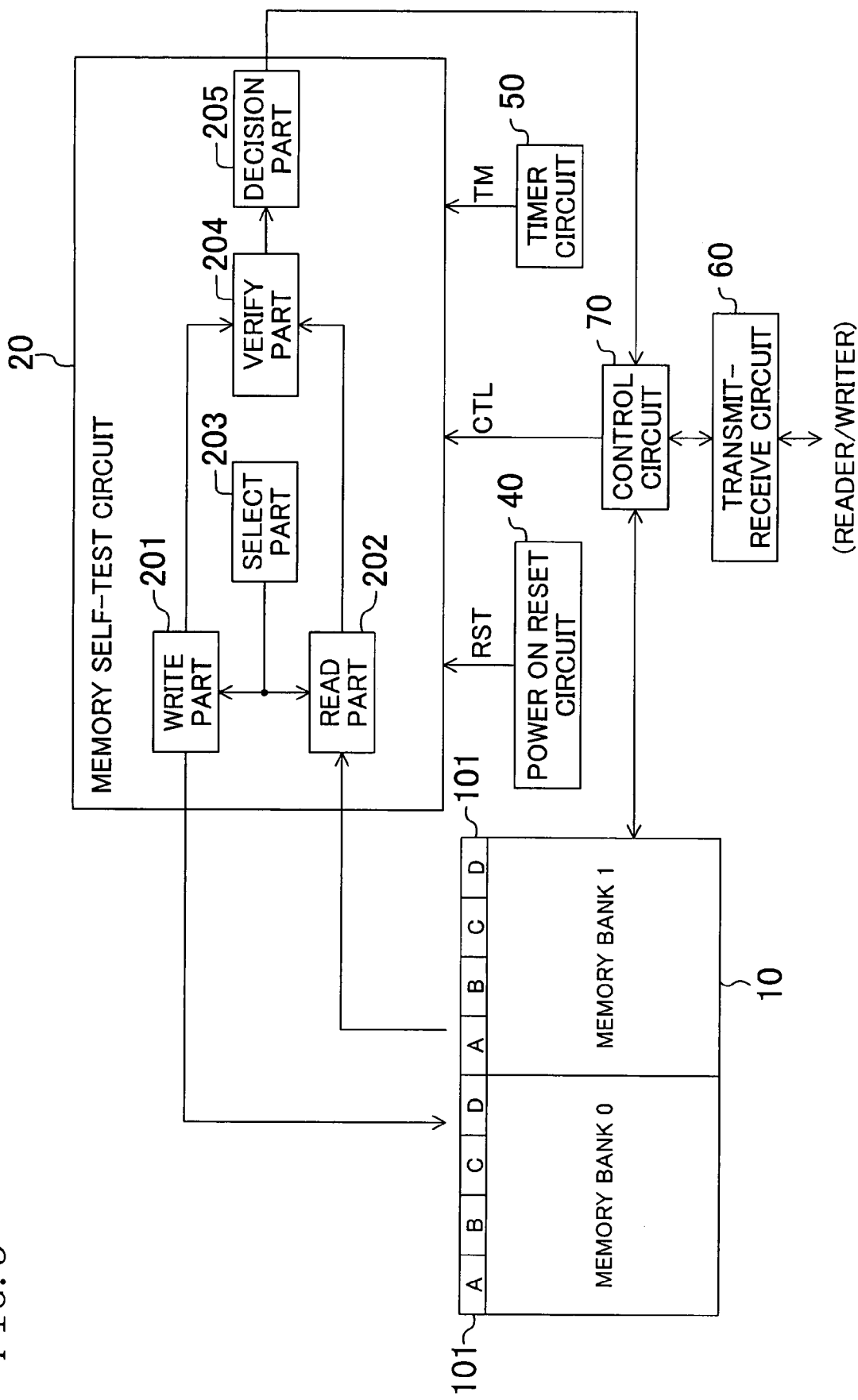
FIG. 3 is a diagram for showing the architecture of an IC card according to Embodiment 2.

FIG. 3 shows the architecture of an IC card according to Embodiment 2. The present IC card includes a nonvolatile memory 10, a memory self-test circuit 20, a transmit-receive circuit 60 and a control circuit 70. The nonvolatile memory 10, the memory self-test circuit 20, a power on reset circuit 40 and a timer circuit 50 are the same as those described above.

The transmit-receive circuit 60 receives a command from and transmits a response to a reader/writer not shown through radio or wire communication. The control circuit 70 accesses the nonvolatile memory 10 properly in accordance with the command received by the transmit-receive circuit 60 for reading/writing data and transmits the read data properly to the transmit-receive circuit 60. Also, the control circuit 70 outputs a control signal CTL before or after accessing the nonvolatile memory 10 in accordance with the received command. The memory self-test circuit 20 checks the soundness of the nonvolatile memory 10 in response to the control signal CTL. Therefore, the control circuit 70 cannot access the nonvolatile memory 10 or the response cannot be transmitted from the transmit-receive circuit 60 to the reader/writer unless the soundness of the nonvolatile memory 10 is confirmed by the memory self-test circuit 20. Accordingly, even when the nonvolatile memory 10 has been physically modified, confidential information stored therein is prevented from being invalidly read or a process result based on invalid data is prevented from being transmitted to the reader/writer.

Figure 4:
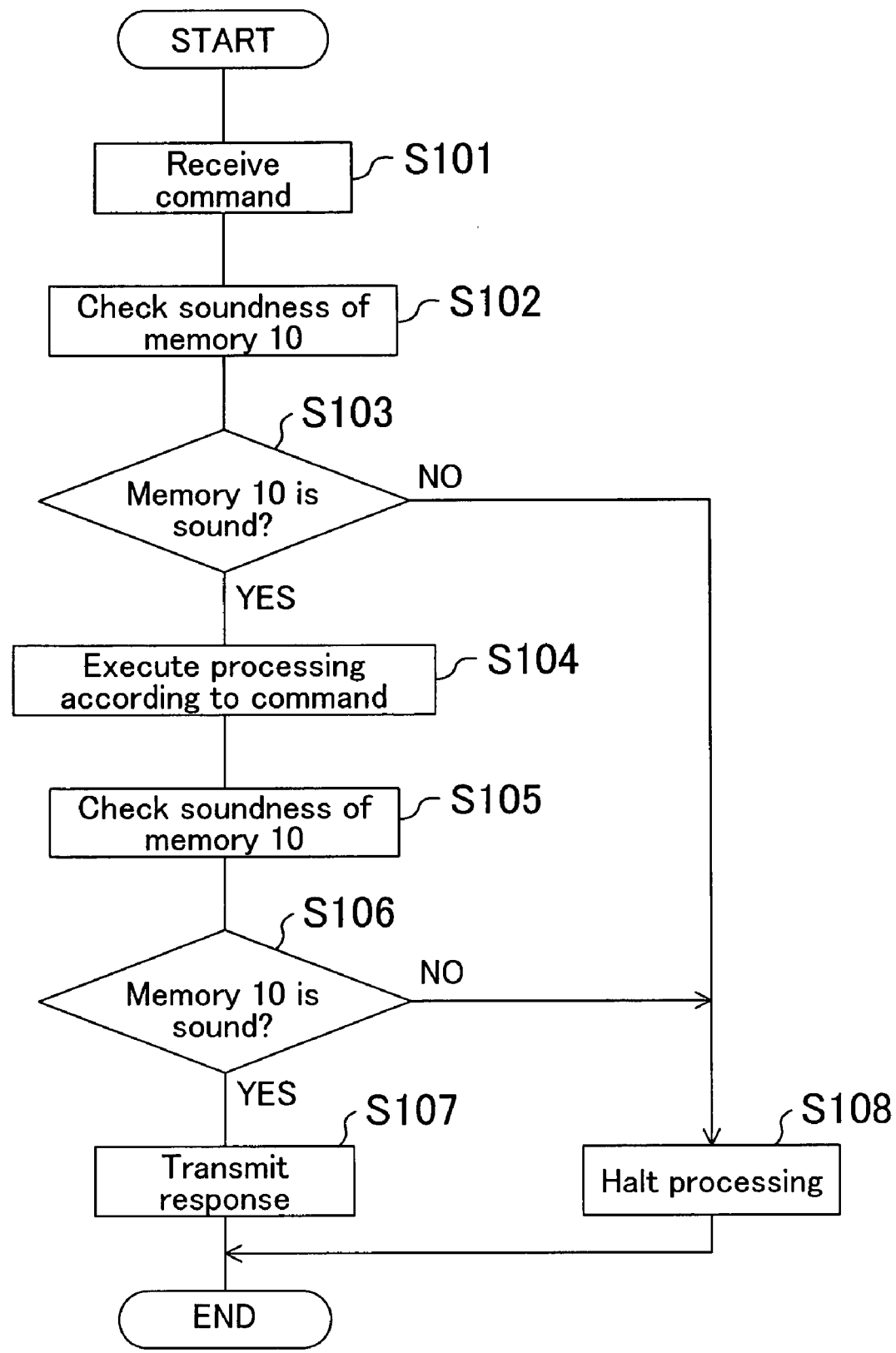
FIG. 4 is a flowchart for the IC card shown in FIG. 3.

Next, the operation of the present IC card will be described with reference to a flowchart of FIG. 4. First, a command output from a reader/writer is received by the transmit-receive circuit 60 (step S101), and the soundness of the nonvolatile memory 10 is checked by the memory self-test circuit 20 (step S102). In the case where the soundness of the nonvolatile memory 10 is confirmed (i.e., YES in step S103), processing in accordance with the command is executed by the control circuit 70 so as to write/read data in/from the nonvolatile memory 10 (step S104). Thereafter, the soundness of the nonvolatile memory 10 is checked by the memory self-test circuit 20 (step S105). Then, in the case where the soundness of the nonvolatile memory 10 is confirmed (i.e., YES in step S106), for example, data read from the nonvolatile memory 10 is transmitted as a response from the transmit-receive circuit 60 to the reader/writer (step S107). On the other hand, in the case where it is determined in step S103 or S106 that abnormality has been caused in the nonvolatile memory 10 (i.e., NO), access to the nonvolatile memory 10 is inhibited and following processing is halted (step S108).

In this manner, in an IC card including a nonvolatile memory according to the present embodiment, an invalid access such as security attack utilizing abnormality of the nonvolatile memory is restricted without degrading the operation characteristics and the lifetime of the nonvolatile memory, so that highly confidential data stored in the nonvolatile memory can be effectively protected.

The control circuit 70 may output a control signal CTL either before or after accessing the nonvolatile memory 10 in accordance with the received command. Specifically, in the flowchart of FIG. 4, either procedures of steps S102 and S103 or procedures of steps S105 and S106 may be omitted.

In this manner, the memory self-test circuit of this invention easily determines whether or not a nonvolatile memory has been physically modified and hence is useful as a test circuit for particularly a nonvolatile memory that stores confidential information to be protected from modification or an invalid accesses and is restricted in the number of write times or the like.

What is claimed is:

1. A memory self-test circuit for a nonvolatile memory comprising:
   a write part for writing data in a given address of a special region of said nonvolatile memory;
   a read part for reading said written data from the given address;
   a verify part for determining whether or not said written data accords with said read data; and
   a decision part for determining, on the basis of a result of determination made by said verify part, that said nonvolatile memory is sound when said written data accords with said read data and that said nonvolatile memory is unsound when said written data does not accord with said read data.

2. The memory self-test circuit of claim 1,
   wherein said nonvolatile memory includes a plurality of memory banks each having a special region,
   said write part writes data in the given address of said special region of each of said plurality of memory banks,
   said read part reads said written data from the given address of each of said plurality of memory banks,
   said verify part determines whether or not said written data accords with said read data in each of said plurality of memory banks, and
   said decision part determines that said nonvolatile memory is sound when said written data accords with said read data in all of said plurality of memory banks and that said nonvolatile memory is unsound when said written data does not accord with said read data in all of said plurality of memory banks.

3. The memory self-test circuit of claim 1, further comprising a select part for selecting one address out of a plurality of addresses of said special region,
   wherein said write part writes data in said address selected by said select part, and
   said read part reads said written data from said address selected by said select part.

4. The memory self-test circuit of claim 3,
   wherein said select part selects one of said plurality of addresses at random.

5. The memory self-test circuit of claim 3,
   wherein said select part selects one of said plurality of addresses in turn.

6. A semiconductor device equipped with a nonvolatile memory comprising:
   a memory self-test circuit for checking soundness of said nonvolatile memory,
   wherein said memory self-test circuit includes:
      a write part for writing data in a given address of a special region of said nonvolatile memory;
      a read part for reading said written data from the given address;
      a verify part for determining whether or not said written data accords with said read data; and
      a decision part for determining, on the basis of a result of determination made by said verify part, that said nonvolatile memory is sound when said written data accords with said read data and that said nonvolatile memory is unsound when said written data does not accord with said read data.

7. The semiconductor device of claim 6, further comprising a power on reset circuit for outputting a reset signal when power is supplied to said semiconductor device,
   wherein said memory self-test circuit checks the soundness of said nonvolatile memory in response to said reset signal.

8. The semiconductor device of claim 6, further comprising a timer circuit for outputting a timer signal every time a given length of time is timed,
    wherein said memory self-test circuit checks the soundness of said nonvolatile memory in response to said timer signal.

9. The semiconductor device of claim 6, further comprising a CPU for executing a provided program and outputting a control signal when a library function related to an access to said nonvolatile memory is invoked,
    wherein said memory self-test circuit checks the soundness of said nonvolatile memory in response to said control signal.

10. The semiconductor device of claim 6, further comprising a CPU for executing a provided program and outputting a control signal when an instruction specified by a user is executed,
    wherein said memory self-test circuit checks the soundness of said nonvolatile memory in response to said control signal.

11. An IC card equipped with a nonvolatile memory comprising:
    a memory self-test circuit for checking soundness of said nonvolatile memory,
    wherein said memory self-test circuit includes:
        a write part for writing data in a given address of a special region of said nonvolatile memory;
        a read part for reading said written data from the given address;
        a verify part for determining whether or not said written data accords with said read data; and
        a decision part for determining, on the basis of a result of determination made by said verify part, that said nonvolatile memory is sound when said written data accords with said read data and that said nonvolatile memory is unsound when said written data does not accord with said read data.

12. The IC card of claim 11, further comprising:
    a transmit-receive circuit for communicating with a reader/writer; and
    a control circuit for accessing said nonvolatile memory in accordance with a command received by said transmit-receive circuit and outputting a control signal before accessing said nonvolatile memory,
    wherein said memory self-test circuit checks the soundness of said nonvolatile memory in response to said control signal, and
    said control circuit accesses said nonvolatile memory when the soundness of said nonvolatile memory is confirmed by said memory self-test circuit.

13. The IC card of claim 11, further comprising:
    a transmit-receive circuit for communicating with a reader/writer; and
    a control circuit for accessing said nonvolatile memory in accordance with a command received by said transmit-receive circuit and outputting a control signal after accessing said nonvolatile memory,
    wherein said memory self-test circuit checks the soundness of said nonvolatile memory in response to said control signal, and
    said control circuit instructs said transmit-receive circuit to transmit a response when the soundness of said nonvolatile memory is confirmed by said memory self-test circuit.

14. A memory self-test method for checking soundness of a nonvolatile memory comprising:
    a first step of writing data in a given address of a special region of said nonvolatile memory;
    a second step of reading said written data from the given address;
    a third step of determining whether or not said written data accords with said read data; and
    a fourth step of determining, on the basis of a result of determination made in the third step, that said nonvolatile memory is sound when said written data accords with said read data and that said nonvolatile memory is unsound when said written data does not accord with said read data.

15. The memory self-test method of claim 14,
    wherein said nonvolatile memory includes a plurality of memory banks each having a special region,
    data is written in the given address of said special region of each of said plurality of memory banks in the first step,
    said written data is read from the given address of each of said plurality of memory banks in the second step,
    it is determined in the third step whether or not said written data accords with said read data in each of said plurality of memory banks, and
    it is determined in the fourth step that said nonvolatile memory is sound when said written data accords with said read data in all of said plurality of memory banks and that said nonvolatile memory is unsound when said written data does not accord with said read data in all of said plurality of memory banks.

16. The memory self-test method of claim 14, further comprising a fifth step of selecting one of a plurality of address of said special region,
    wherein in the first step, data is written in said address selected in the fifth step, and
    in the second step, said data written in the first step is read from said address selected in the fifth step.

17. The memory self-test method of claim 16,
    wherein one of said plurality of addresses is selected at random in the fifth step.

18. The memory self-test method of claim 16,
    wherein one of said plurality of addresses is selected in turn in the fifth step.

* * * * *